US006603511B1

United States Patent
Ishida

(10) Patent No.: US 6,603,511 B1
(45) Date of Patent: Aug. 5, 2003

(54) SOLID-STATE IMAGING DEVICE AND ELECTRONIC CAMERA FOR MONITORING QUANTITY OF INCIDENT LIGHT

(75) Inventor: Tomohisa Ishida, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/273,307

(22) Filed: Mar. 19, 1999

(30) Foreign Application Priority Data

Mar. 20, 1998 (JP) .......................... 10-090695

(51) Int. Cl.[7] .................. H04N 5/335; H01L 27/148
(52) U.S. Cl. ........................ 348/294; 257/230
(58) Field of Search .................. 348/294, 296, 348/297, 298, 299, 257; 257/222, 223, 230, 231

(56) References Cited

U.S. PATENT DOCUMENTS

| | | | |
|---|---|---|---|
| 3,770,967 A | | 11/1973 | Hanna et al. |
| 4,612,629 A | * | 9/1986 | Harari ........................ 257/222 |
| 4,819,074 A | * | 4/1989 | Suzuki ........................ 348/294 |
| 4,841,349 A | | 6/1989 | Nakano |
| 5,471,515 A | | 11/1995 | Fossum et al. |
| 5,563,429 A | | 10/1996 | Isogai |
| 5,602,407 A | * | 2/1997 | Washkurak et al. ......... 257/223 |
| 5,739,562 A | | 4/1998 | Ackland et al. |
| 5,854,498 A | | 12/1998 | Merrill |
| 5,861,621 A | | 1/1999 | Takebe et al. |
| 5,869,857 A | | 2/1999 | Chen |
| 6,046,466 A | * | 4/2000 | Ishida et al. ................ 257/230 |
| 6,051,852 A | * | 4/2000 | Stevens ........................ 257/223 |
| 6,051,857 A | * | 4/2000 | Miida ........................... 257/292 |
| 6,069,376 A | * | 5/2000 | Merrill ......................... 257/222 |
| 6,266,087 B1 | * | 7/2001 | Hynecek et al. ............. 257/230 |
| 6,452,633 B1 | * | 9/2002 | Merrill et al. ............... 348/294 |

FOREIGN PATENT DOCUMENTS

JP          08293591 A       11/1996

OTHER PUBLICATIONS

U.S. patent application Ser. No. 09/209,322, Ishida et al., filed Dec. 1998.

* cited by examiner

Primary Examiner—Wendy R. Garber
Assistant Examiner—Rashawn N. Tillery
(74) Attorney, Agent, or Firm—Klarquist Sparkman LLP

(57) ABSTRACT

Solid-state imaging devices and cameras using such devices are provided. The devices detect changes in light quantity, directly incident to a light-receiving portion, in real-time and then read light information at an optimum exposure level whenever estimates of the quantity of incident light are difficult to obtain and whenever the quantity of incident light suddenly changes from an estimated value. To such end, the devices include a charge-transfer portion that generates and stores signal charges in response to incident light and then transfers the signal charges, an output portion that outputs the signal charge as an electrical signal, a semiconductor region that generates an optical current in proportion to the quantity of incident light, a shading membrane having an aperture portion formed on the semiconductor region, and a read portion that reads out the optical current, generated by light incident to the semiconductor region through the aperture portion, to the exterior of the semiconductor region.

9 Claims, 11 Drawing Sheets

SOLID-STATE IMAGING DEVICE AND ELECTRONIC CAMERA FOR MONITORING QUANTITY OF INCIDENT LIGHT

FIELD OF THE INVENTION

The present invention is related to solid-state imaging devices and cameras incorporating such devices. In particular, the invention pertains to such devices and cameras that can monitor the quantity of incident light.

BACKGROUND OF THE INVENTION

FIG. 13(a) is a top view showing a typical composition of a picture element unit (pixel) in a conventional solid-state imaging device.

FIG. 13(b) is a cross section along the line 13b—13b shown in FIG. 13(a), and FIG. 13(c) is a cross section along the line 13c—13c shown in FIG. 13(a).

This solid-state imaging device is a frame-transfer type CCD picture element sensor (hereinafter referred to as simply "CCD") having a lateral overflow drain construction (hereinafter referred to as "LOD").

As shown in FIG. 13(b), N-type semiconductor regions 2, 3 are formed on the surface of a P-type semiconductor substrate 1. As shown in FIG. 13(a), the N-type semiconductor regions 2 and 3 are alternately formed facing toward the longitudinal direction of the figure. The impurity concentration in the N-type semiconductor region 3 is higher than in the N-type semiconductor region 2. Further, as shown in FIG. 13(c), an N-type semiconductor region (LOD diffusion region) 4 and P-type semiconductor regions 5, 6 are formed on the surface of the P-type semiconductor substrate 1, and the N-type semiconductor region 4 is positioned between the P-type semiconductor regions 5 and 6.

An oxidation layer 7 is formed on the N-type semiconductor regions 2, 3, 4 and the P-type semiconductor regions 5, 6, and vertical-transfer gate electrodes 8a, 8b are formed on this oxidation layer 7. The vertical-transfer gate electrodes 8a, 8b comprise, for example, transparent polysilicon. As shown in FIG. 13(a), the gate electrodes 8a and 8b extend in the horizontal direction and are alternately wired facing toward the longitudinal direction.

A vertical-transfer portion 9 comprises the N-type semiconductor regions 2 and 3. This vertical-transfer portion 9 also functions as a light-receiving portion and is a region where the optical-signal charges Qs (electrons in this case) generated by light incident on the CCD are stored and transferred. Moreover, the P-type semiconductor region 5 functions as an anti-blooming barrier. Any excessive electrical charge Qex that cannot be stored in the-vertical-transfer portion 9 invades the region 5 and is discharged to the LOD diffusion region 4 (N-type semiconductor region). In addition, the P-type semiconductor region 6 functions as a pixel-separation region. The normal size of a pixel is approximately 5–20 μm. Because a shading membrane that blocks light impinging on a pixel portion is not formed in this type of solid-state imaging device, light impinges on the entire pixel portion.

FIG. 14 is a compositional drawing showing a CCD wherein pixel units of the solid-state imaging device shown in FIG. 13(a) are arranged in a two-dimensional matrix. This CCD comprises a light-receiving portion 10 and a horizontal-transfer portion 11 comprising the vertical transfer portion 9 of FIG. 13(a).

FIG. 15 is a top view showing a typical end portion (and its periphery), of the vertical-transfer portion 9 shown in FIG. 13(a). Aluminum wiring 13 is connected through a contact region 9b to an N-type region 9a of the end portion of the vertical-transfer portion 9 positioned on a side opposite the horizontal-transfer portion 11. An electrical potential Vr is applied to the aluminum wiring 13. The potential Vr causes the bias of the vertical-transfer portion 9 to be opposite the bias of the P-type semiconductor substrate 1. Further, a gate electrode 8c is formed between the aluminum wiring 13 and the gate electrode 8b, and a constant electrical potential Vc is applied to the gate electrode 8c. Overflow wiring 14 is connected through a contact region 4a to the end portion of the LOD diffusion region 4, and a constant electrical potential Vf is applied from a terminal 18 through the overflow wiring 14 to the LOD diffusion region 4. The potential Vf has a bias opposite to the bias of the P-type semiconductor substrate 1.

In the CCD of FIG. 14, an optical-signal charge Qs is generated and stored in each pixel by means of light incident on the vertical-transfer portion 9. Next, the optical-signal charge Qs is transferred to the horizontal-transfer portion 11 and further transferred from the horizontal-transfer portion 11 to an output amplifier 12. The optical-signal charge Qs is then output to the exterior of the element as a signal Vout through the output amplifier 12. From among the optical-signal charges Qs, excessive electrical charge Qex that cannot be stored in the vertical-transfer portion 9 overflows into the LOD diffusion region 4. The excessive electrical charge Qex overflowing into the LOD diffusion region 4 is discharged through the overflow wiring 14 on which is applied a constant electrical potential Vf.

Next, a combined operation by the above-mentioned CCD and shutter to capture a still picture will be described using the drive-timing chart shown in FIG. 16.

First, a pre-exposure initialization is carried out in a state in which the shutter is closed during the period Tp1. Namely, in order to reset the electrical charge stored in the horizontal-transfer portion 11, a clock pulse (not shown in figure) is applied to the horizontal-transfer portion 11, and the electrical charges of the horizontal-transfer portion 11 successively transfer to the output amplifier 12. Thereafter, clock pulses φV1, φV2 are applied to the vertical-transfer gate electrodes 8a, 8b, and the electrical charges stored in the vertical-transfer portion 9 successively transfer to the horizontal-transfer portion 11. After an electrical charge transferred to the horizontal-transfer portion 11 in this manner is transferred within the horizontal-transfer portion 11, the electrical charge is output through the output amplifier 12 and is then reset. The vertical-transfer portion 9 and the horizontal-transfer portion 11 are reset by means of this sequence of transfer operations.

Thereafter, in the period Tp2, after the clock pulses φV1, φV2 applied to the vertical-transfer gate electrodes 8a, 8b are maintained at an "L" (low) level, the shutter opens and the CCD enters an exposure state. Because the impurity concentration in the N-type semiconductor region 3 is higher than the impurity concentration in the N-type semiconductor region 2, the optical-signal charge Qs is stored in the N-type semiconductor region 3 during the period Tp2.

Next, in the period Tp3, the shutter is closed, a clock pulse is applied to the vertical-transfer portion 9 and the horizontal-transfer portion 11; the optical-signal charge Qs is transferred, and a picture signal is output from the output amplifier 12 to the exterior of the element.

In other words, when φV1 becomes a "H" (high) level, the optical-signal charge Qs stored in the N-type semiconductor region 3 under the vertical-transfer gate electrodes 8a, 8b in the exposure state of the period Tp2 is collected in the N-type semiconductor region 3 under the vertical-transfer gate electrode 8a to which the clock pulse φV1 is applied. Thereafter, when φV2 becomes a "H" (high) level, the optical signal charge Qs of the N-type semiconductor region 3 is transferred to the N-type semiconductor region 3 under the vertical-transfer gate electrode 8b on which the clock pulse φV2 of an adjacent pixel is applied. The electrical signal charge in FIG. 13(a) is transferred in the upward direction. That is, when the clock pulse φV2 rises to a "H" (high) level, the optical-signal charge Qs is transferred from the vertical-transfer portion 9 to the horizontal-transfer portion 11. Before the clock pulse φV2 rises to a "H" (high) level, the optical-signal charge Qs of the horizontal-transfer portion 11 is transferred to the output amplifier 12 and a picture signal is output to the exterior of the element. In this manner, the optical-signal charges Qs of one picture portion are sequentially read out.

Because picture capturing is carried out using a predetermined exposure time (i.e., period Tp2 of FIG. 16) in the above-mentioned conventional solid-state imaging device, if the quantity of incident light suddenly increases and changes from an estimated value during this exposure time, it will become impossible to read light information at an optimum exposure level. The following methods have been considered as methods to solve this problem.

As a first method, an exposure-control sensor is disposed at a position separate from an optical system (light-receiving portion) of a solid-state imaging device. The light intensity from an object to be photographed is monitored by the sensor and the exposure is adjusted accordingly. As a second method, an exposure-control sensor provided with a half mirror is disposed within an optical system of a solid-state imaging device. One portion of the light (i.e., light passing through a lens) incident on the optical system is removed by means of the half mirror. The removed light is monitored by the sensor and the exposure is adjusted accordingly. As a third method, an exposure-control sensor is disposed close to a light-receiving portion of a solid-state imaging device. Light incident on an optical system is reflected by the receiving portion. The reflected light is monitored by the sensor and the exposure is adjusted accordingly.

In the first method summarized above, however, because the intensity of light that is directly incident on the light-receiving portion of the solid-state imaging device is not monitored, there is a problem of poor accuracy of the exposure control. In the second method, because one portion of the light incident on the solid-state imaging device is removed by the half mirror, there is a problem of loss of one portion of the incident light, leading to unfavorable sensitivity. In the third method, because light incident on the solid-state imaging device does not undergo scattering, the intensity of the reflected light is greatly reduced. The resulting problem is that incident light is not monitored with good accuracy.

SUMMARY OF THE INVENTION

The present invention takes into consideration the above-mentioned facts concerning the prior art and has an object of providing a solid-state imaging device, and a camera comprising such a device, that can directly detect changes in light intensity incident to a light-receiving portion in real-time. Another object is to provide such a device and camera that can read light information at an optimum exposure level whenever estimates of the intensity of incident light are difficult to obtain and whenever the intensity of incident light suddenly changes from an estimated value.

In order to solve the above-mentioned problems, a solid-state imaging device according to a first embodiment of the present invention comprises a charge-transfer portion that generates and stores electrical charges in response to incident light, and transfers the signal charges. The device also comprises an output portion that outputs the signal charge transferred from the charge-transfer portion as an electrical signal. The device also comprises a semiconductor region that generates a signal charge in proportion to the quantity of incident light. The device also comprises a shading membrane having an aperture portion formed on the semiconductor region.

Further with respect to the first embodiment, a semiconductor region generates a signal charge in proportion to the quantity of incident light. Therefore, it is possible to generate signal charges, that are separate from the charge-transfer portion, in proportion to the quantity of incident light to the semiconductor region through an aperture portion. This causes a signal charge to be generated in the semiconductor region in real-time during an exposure. The signal charge is proportional to the quantity of light incident to the solid-state imaging device. Because of this, it is possible to detect changes in light intensity directly incident to the light-receiving portion in real-time and then read light information at an optimum exposure level whenever estimates of the intensity of incident light are difficult to obtain and whenever the intensity of incident light suddenly changes from an estimated value.

A solid-state imaging device according to a second embodiment of the present invention comprises a charge-transfer portion that generates and stores signal charges in response to incident light and then transfers the signal charge. The device also comprises an output portion that outputs the signal charge transferred from the charge-transfer portion as an electrical signal. The device also comprises a semiconductor region, formed adjacent to the charge-transfer portion, through which any excess signal charge generated by the charge-transfer portion flows. The semiconductor region also generates a signal charge in proportion to the intensity of incident light. The device also comprises a shading membrane having an aperture portion formed on the semiconductor region.

The semiconductor region through which excess signal charge flows and that generates a signal charge in proportion to the intensity of incident light can be made to function as an overflow drain region in addition to generating signal charges (separately from the charge-transfer portion) in proportion to the intensity of light incident thereto through an aperture portion.

It is desirable to further include a read portion that reads out signal charges generated by light incident to the semiconductor region through the aperture portion to the exterior of the semiconductor region.

A solid-state imaging device according to a third embodiment of the present invention comprises a charge-transfer portion that generates and stores signal charges in response to incident light. The charge-transfer portion then transfers the signal charges to an output portion that outputs the signal charges, transferred from the charge-transfer portion, as an electrical signal. The device includes a semiconductor region that generates a signal charge in proportion to the intensity of incident light, and a shading membrane having an aperture portion formed on the semiconductor region. This solid-state imaging device further includes a plurality of aperture areas formed by gathering a plurality of apertures from among the aperture portions. The semiconductor region generates a signal charge in proportion to the intensity of light incident to each aperture area. This causes a signal charge to be generated in proportion to the intensity of light incident to the aperture areas in the semiconductor region in real-time during an exposure.

A solid-state imaging device according to a fourth embodiment of the present invention comprises a plurality of charge-transfer portions that generate and store signal charges in response to incident light and then transfer the signal charges. The device includes an output portion that outputs the signal charges, transferred from the charge-transfer portions, as an electrical signal. The device includes a semiconductor region formed adjacent to each charge-transfer portion. Excess signal charge generated by the charge-transfer portions flows through the semiconductor region which generates a signal charge in proportion to the intensity of incident light. A shading membrane is also provided that has an aperture portion formed on the semiconductor region. The solid-state imaging device further includes a plurality of aperture areas formed by gathering a plurality of apertures from among the aperture portions.

Further, it is desirable to include a read portion that reads out signal charges, generated by light incident to the semiconductor region through the aperture portion, to the exterior of the semiconductor region.

A camera according to a fifth embodiment of the present invention comprises a charge-transfer portion that generates and stores signal charges in response to incident light and then transfers the signal charges. The camera also includes an output portion that outputs the signal charges, transferred from the charge-transfer portion, as an electrical signal. The camera also includes a semiconductor region that generates an electrical current proportional to the intensity of incident light. The camera also includes a shading membrane having an aperture portion formed on the semiconductor region, and a read portion that reads out electrical current, generated by means of light incident to the semiconductor region through the aperture portion, to the exterior of the semiconductor region. The camera further comprises a shutter that blocks light incident to the solid-state imaging device, a current-integration circuit that converts current read from the read portion into voltage, a comparator that compares the voltage to a reference voltage, and a controller that determines, from the output of the comparator, a timing for closing the shutter.

A camera according to a sixth embodiment of the present invention comprises a charge-transfer portion that generates and stores signal charges in response to incident light and then transfers the signal charge; an output portion that outputs the signal charge, transferred from the charge-transfer portion, as an electrical signal; a semiconductor region, formed adjacent to the charge-transfer portion, through which flows excess signal charge generated by the charge-transfer portion and that generates an electrical current proportional to the intensity of incident light; a shading membrane, having an aperture portion, formed on the semiconductor region; and a read portion that reads out electrical current, generated by light incident to the semiconductor region through the aperture portion, to the exterior of the semiconductor region. The camera further comprises a shutter that blocks light incident to the solid-state imaging device; a current-integration circuit that converts current read from the read portion into voltage; a comparator that compares the voltage to a reference voltage; and a controller that determines, from the output of the comparator, a timing for closing the shutter.

The camera can further comprise a strobe that illuminates light onto an object to be photographed, wherein the controller further determines a timing for stopping the generation of light by the strobe.

DETAILED DESCRIPTION

In the following, embodiments of the invention are described with reference to the attached drawings.

FIGS. 1, 3, 5, 7, 9, 10 and 12 depict the solid-state imaging device according to the first embodiment of the present invention.

Figure 1A:
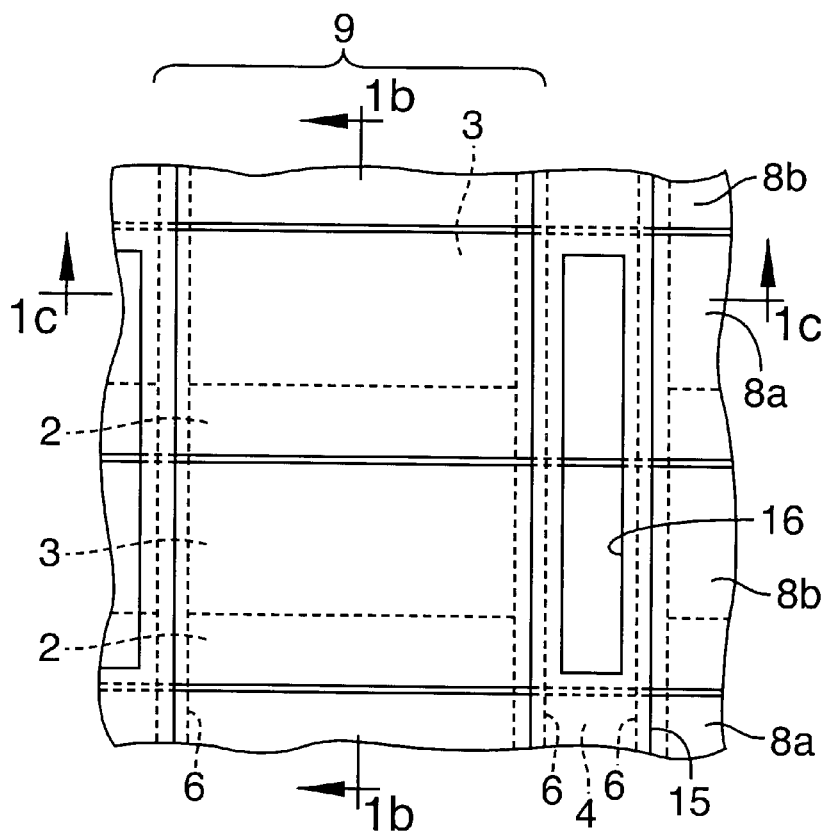
FIG. 1(a) is a top view showing a typical composition of a picture element (pixel) in a solid-state imaging device according to the first embodiment of the present invention.
Figure 1B:
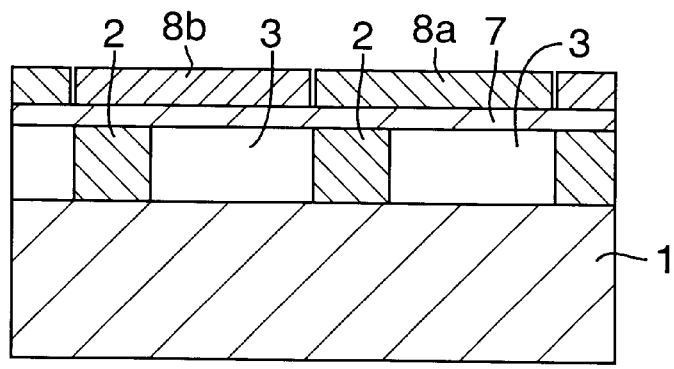
FIG. 1(b) is a cross section along the line 1b—1b shown in FIG. 1(a).
Figure 1C:
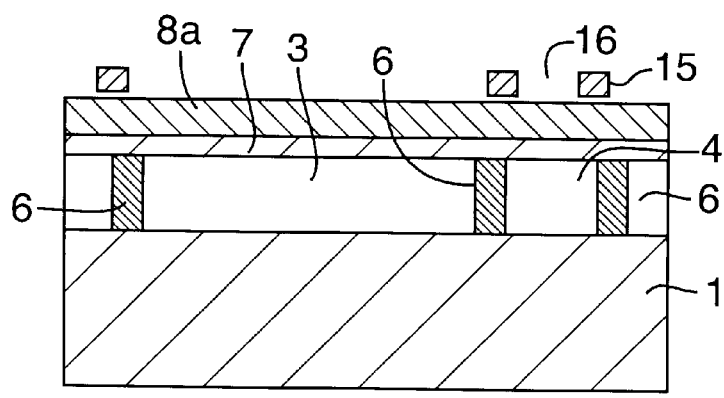
FIG. 1(c) is a cross section along the line 1c—1c shown in FIG. 1(a).

FIG. 1 is a top view showing a typical composition of a picture element unit (pixel) in the solid-state imaging device of the first embodiment. FIG. 1(b) is a cross section along the line 1b—1b shown in FIG. 1(a), and FIG. 1(c) is a cross section along the line 1c—1c shown in FIG. 1(a). This solid-state imaging device is a frame-transfer type CCD pixel sensor provided with an exposure sensor.

As shown in FIG. 1(b), N-type semiconductor regions 2, 3 are formed on the surface of a P-type semiconductor substrate 1. As shown in FIG. 1(a), the N-type semiconductor regions 2 and 3 are alternately formed facing toward the longitudinal direction of the figure. The impurity concentration in the N-type semiconductor region 3 is higher than in the N-type semiconductor region 2. Further, as shown in FIG. 1(c), the N-type semiconductor region 4 and the P-type semiconductor region 6 are formed on the surface of the P-type semiconductor substrate 1. The N-type semiconductor region 4 functions as an exposure sensor and the P-type semiconductor region 6 functions as a pixel-separation region. The normal size of a pixel is approximately 5–20 $\mu$m.

An oxidation layer 7 is formed on the N-type semiconductor regions 2, 3, 4 and the P-type semiconductor region 6. Vertical-transfer gate electrodes 8a, 8b are formed on the oxidation layer 7. The vertical-transfer gate electrodes 8a, 8b comprise, for example, transparent polysilicon. As shown in FIG. 1(a), the gate electrodes 8a and 8b extend in the horizontal direction (in the figure) and are alternately wired facing toward the longitudinal direction (in the figure).

As shown in FIG. 1(a), a vertical-transfer portion 9 comprises the N-type semiconductor regions 2 and 3. The vertical-transfer portion 9 also functions as a light-receiving portion and is a region in which optical-signal charges Qs (electrons in this instance) are stored and transferred, by means of incident light, to the CCD. A shading membrane 15 is formed on the vertical-transfer gate electrodes 8a, 8b to cover the upper portion of the N-type semiconductor region 4. An aperture portion 16 is formed on the shading membrane 15.

In this type of solid-state imaging device, incident light is incident to the vertical-transfer portion 9 and the aperture portion 16, and optical-signal charges are collected in both the N-type semiconductor region 4 and the vertical-transfer portion 9 situated just under the aperture portion 16.

Figure 3:
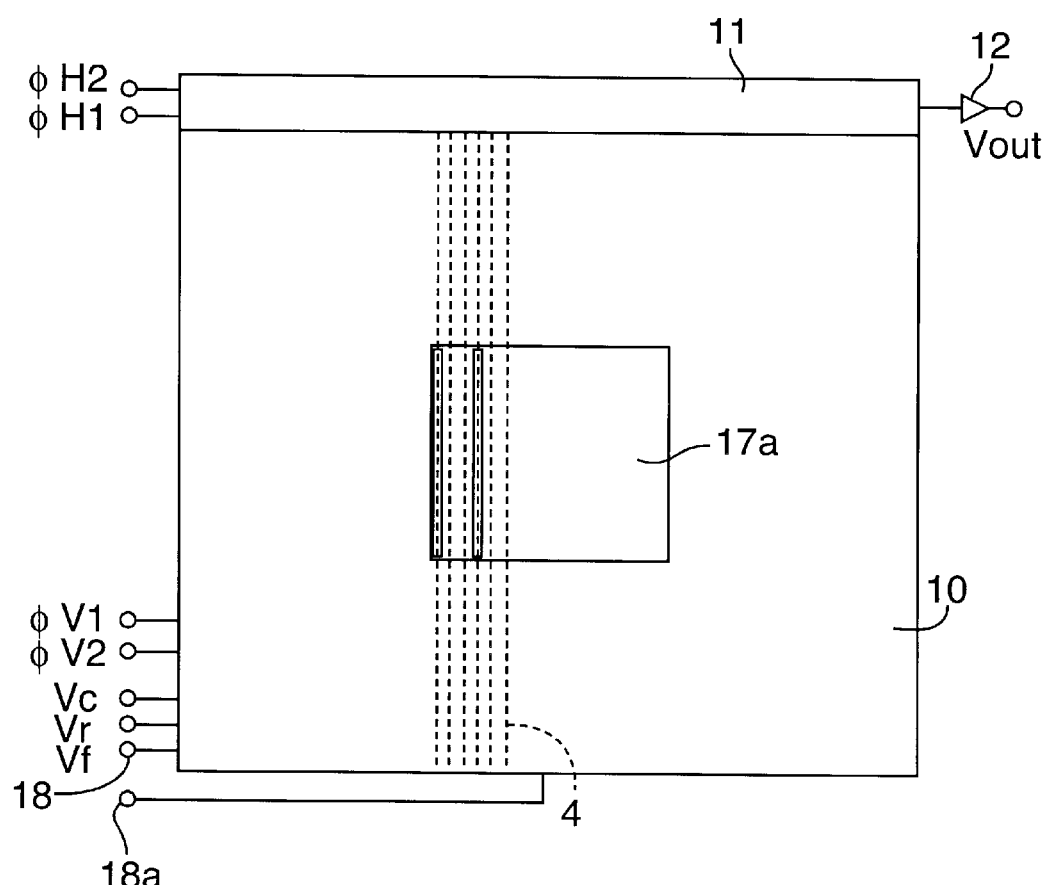
FIG. 3 is a compositional drawing showing a CCD in which the pixels of the solid-state imaging device shown in FIG. 1(a) are arranged in a two-dimensional matrix.

FIG. 3 is a compositional drawing showing a CCD in which pixels of the solid-state imaging device shown in FIG. 1(a) are arranged in a two-dimensional matrix. This CCD is provided with the light-receiving portion 10, in which a plurality of vertical-transfer portions 9 of FIG. 1(a) are arranged, and the horizontal-transfer portion 11. One square-shaped aperture area 17a is disposed at the center portion of the light-receiving portion 10, and the aperture portion 16 is disposed in the aperture area 17a. The aperture portion 16 is positioned above the N-type semiconductor region 4 shown in FIG. 1(a). As a result, the magnitude of the current output from the N-type semiconductor region 4 corresponds with the light intensity incident to the aperture area 17a. Further, an output amplifier 12 is connected to the horizontal-transfer portion 11. Therefore, the optical-signal charge Qs collected in the vertical-transfer portion 9 is transferred to the horizontal-transfer portion 11 and is then output from the output amplifier 12 to the exterior of the element as an image signal.

However, this does not mean that the aperture portion 16 is disposed on all N-type semiconductor regions 4 positioned under the aperture area 17a in this embodiment. The aperture portion 16 is thinned and formed. Therefore, the surface-area density (numerical aperture) of the aperture portion 16 in the aperture area 17a can be freely set by changing the rate at which the aperture portion 16 thins out and providing an aperture portion on every pixel. Further, in FIG. 3, a typical N-type semiconductor region 4 is indicated by the broken lines, and the structures of a pixel and of the shading membrane 15 are omitted.

Figure 5:
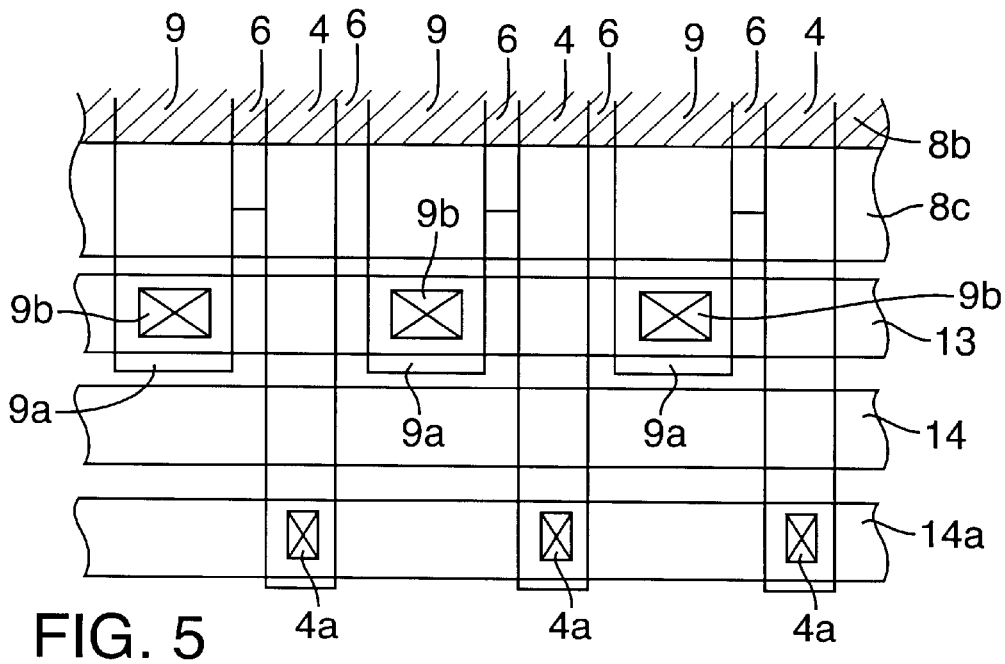
FIG. 5 is a top view showing a typical end portion (and its periphery) of a vertical-transfer portion positioned on a side opposite to the horizontal-transfer portion of the FIG. 3 CCD.

FIG. 5 is a top view showing a typical end portion (and its periphery) of a vertical-transfer portion positioned on a side opposite to the horizontal-transfer portion of FIG. 3. Aluminum wiring 13 is connected through a contact region 9b to the N-type region 9a of the end portion of the vertical-transfer portion 9. An electrical potential Vr is applied to the aluminum wiring 13. The potential Vr causes the bias of the vertical-transfer portion 9 to be opposite the potential of the P-type semiconductor substrate 1. Further, a polysilicon gate electrode 8c is formed between the aluminum wiring 13 and the gate electrode 8b. A constant electrical potential Vc is applied to the gate electrode 8c.

In addition, a signal read line 14a, comprising aluminum wiring equivalent to the aperture area 17a, is connected through the contact region 4a to the end portion of the N-type semiconductor region 4. The signal read line 14a is arranged parallel to the aluminum wiring 13. Therefore, an electrical signal charge Qm generated in the N-type semiconductor region 4 (functioning as an exposure sensor under the aperture portion 16) is output from a terminal 18a of FIG. 3 through the signal read line 14a to the exterior of the element as an electrical current Im. Further, aluminum wiring 14 is formed between the aluminum wiring 13 and the signal read line 14a. The aluminum wiring 14 is electrically connected to the N-type semiconductor region 4 without being disposed under the aperture area 17a of FIG. 3.

Figure 7:
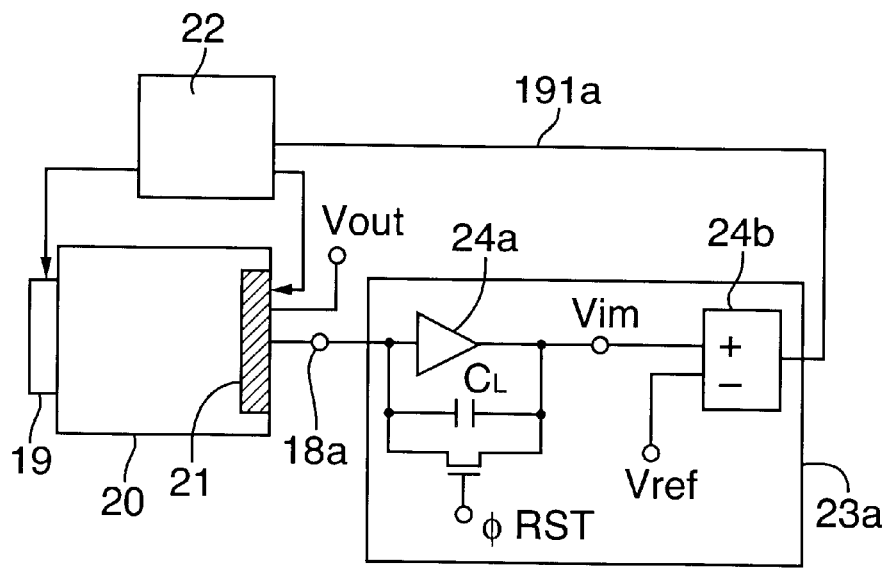
FIG. 7 is a compositional drawing showing an example of a camera including the solid-state imaging device shown in FIG. 3.

FIG. 7 is a compositional drawing showing an example of a digital camera using the solid-state imaging device shown in FIG. 3. This camera includes the solid-state imaging device (CCD) 21 which is disposed within a dark box 20. A shutter 19 is mounted on the dark box 20. The shutter 19 and the CCD 21 are controlled by a controller 22. The terminal 18a, where the current Im is output, is connected to a current-processing circuit 23a. A current-integration circuit 24a and a comparator 24b are included in the current-processing circuit 23a. The current Im is converted to a voltage Vim by the current-integration circuit 24a. The voltage Vim is compared to a reference voltage Vref by the comparator 24b. Whenever the voltage Vim exceeds the reference voltage Vref, a control signal 191a is output to the controller 22. After the control signal 191a is received by the controller 22, a timing in which to close the shutter 19 is determined.

Figure 9:
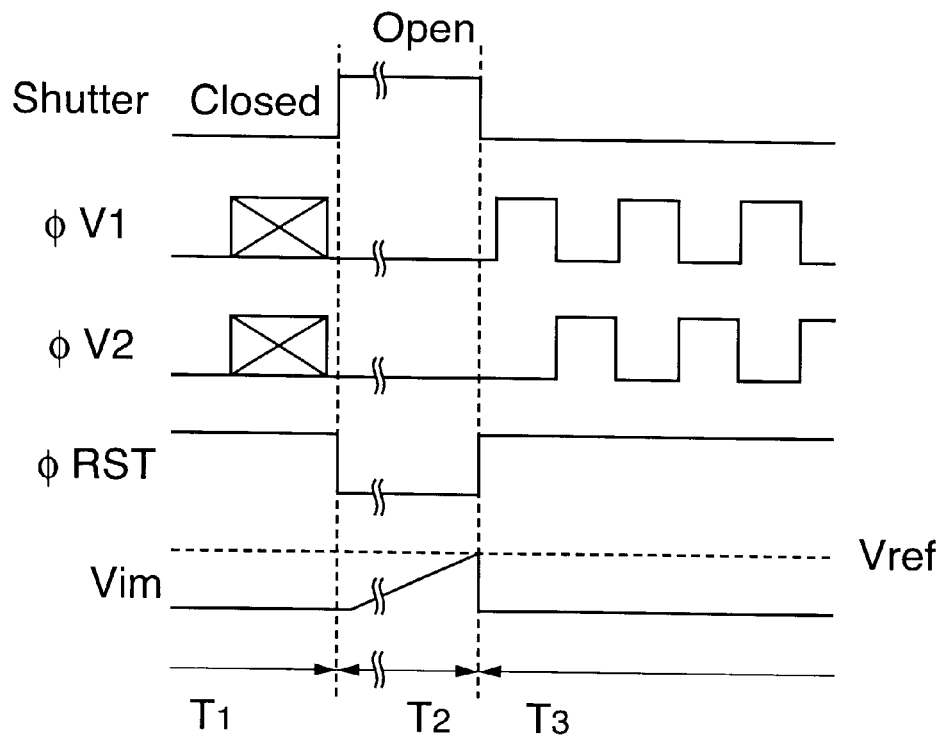
FIG. 9 shows a drive-timing chart of a CCD and shutter when the camera shown in FIG. 7 captures a still picture.

FIG. 9 shows a drive-timing chart of the CCD 21 and the shutter 19 whenever the camera shown in FIG. 7 captures a still picture. First, a pre-exposure initialization of the CCD 21 is carried out in a state in which the shutter 19 is closed during the period T1. The initialization of CCD 21 is carried out by resetting the electrical charge stored in the vertical-transfer portion 9 and the horizontal-transfer portion 11 using conventional operations.

In other words, in order to reset the electrical charge stored in the horizontal-transfer portion 11 of FIG. 3, a clock pulse (not shown in figure) is applied to the horizontal-transfer portion 11. The electrical charge of the horizontal-transfer portion 11 successively transfers and discharges to the output amplifier 12. Thereafter, clock pulses φV1, φV2 are applied to the vertical-transfer gate electrodes 8a, 8b, and the electrical charge stored in the vertical-transfer portion 9 successively transfers to the horizontal-transfer portion 11. After an electrical charge transferred to the horizontal-transfer portion 11 in this manner is transferred within the horizontal-transfer portion 11, the charge is output through the output amplifier 12 and is then reset. The vertical-transfer portion 9 and the horizontal-transfer portion 11 are reset by means of this sequence of transfer operations.

Next, in the period T2, after clock pulses φV1, φV2 applied to the vertical-transfer gate electrodes 8a, 8b are maintained at an "L" (low) level, the shutter 19 of FIG. 7 opens, and the CCD 21 enters an exposure state. At this time, the optical-signal charge Qs is stored in the N-type semiconductor region 2 of FIG. 3. When the shutter 19 opens, the current Im, arising in the aperture area 17a disposed in the light-receiving portion of the CCD 21, flows to the current-processing circuit 23a, and the output Vim of the current-integration circuit 24a changes (rises) as shown in FIG. 9. Because the output Vim is proportional to the exposure intensity due to the light incident to the CCD 21, a desired exposure level can be obtained in real-time during an exposure by means of monitoring the output Vim. Namely, whenever the output Vim of the current- integration circuit 24a of FIG. 9 exceeds a reference voltage Vref, the control signal 191a transfers from the current-processing circuit 23a to the controller 22. Then the controller 22 closes the shutter 19. Further, the reference voltage Vref is an output voltage whenever an optimum exposure level is obtained.

Afterward, in the period T3, a clock pulse is applied to the vertical-transfer portion 9 and the horizontal-transfer portion 11, the signal charge Qs is transferred, and a picture signal is output from the output amplifier 12 to the exterior of the element.

In other words, whenever φV1 becomes a "H" (high) level, the signal charge Qs stored in the N-type semiconductor region 3 under the vertical-transfer gate electrodes 8a, 8b during the period Tp2 is collected in the N-type semiconductor region 3 under the vertical-transfer gate electrode 8a on which the clock pulse φV1 is applied. Thereafter, when φV2 becomes a "H" (high) level, the signal charge Qs of the N-type semiconductor region 3 is transferred to the N-type semiconductor region 2 under the vertical-transfer gate electrode 8b on which the clock pulse φV2 of an adjacent pixel is applied. The signal charge in FIG. 1(a) is transferred in the upward direction. That is, whenever the clock pulse φV2 rises to a "H" (high) level, the signal charge Qs is transferred from the vertical-transfer portion 9 to the horizontal-transfer portion 11; before the clock pulse φV2 rises to a "H" (high) level, the signal charge Qs of the horizontal-transfer portion 11 is transferred to the output amplifier 12 and a picture signal is output to the exterior of the element. In this manner, the signal charge Qs of one picture portion is sequentially read out.

According to the first embodiment described above, the intensity of incident light can be monitored in real-time during an exposure by driving the CCD 21 of FIG. 7 using the sequence of operations occurring in the periods T1 to T3 shown in FIG. 9. Because of this, even if the quantity of incident light changes suddenly, imaging is always possible using an optimum exposure time.

Figure 10:
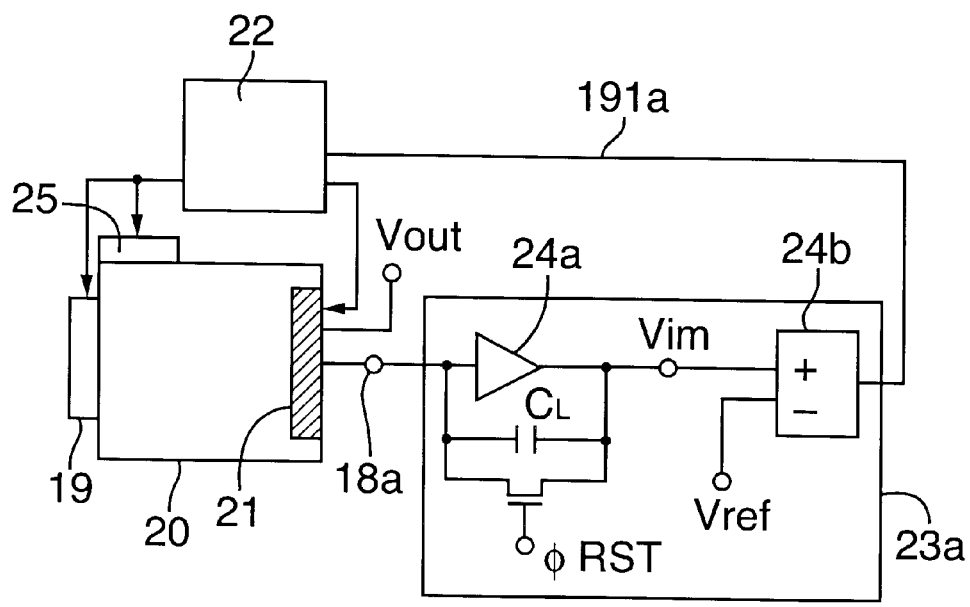
FIG. 10 is a compositional drawing showing another example of a camera including the solid-state imaging device shown in FIG. 3.

FIG. 10 is a compositional drawing showing another example of a camera using the solid-state imaging device shown in FIG. 3. Identical symbols are used for components that are identical to those of FIG. 7. Only the different components are described below.

The camera of FIG. 10 uses a different method of exposure control from the camera of FIG. 7. An auxiliary light-emission device 25 (hereinafter referred to as a "strobe") is mounted to the exterior of a dark box 20. The strobe 25 is controlled by a controller 22a. This camera utilizes a method of exposure control in which the strobe 25 is used to illuminate light onto an object to be photographed. At the moment the exposure intensity incident to the CCD 21 reaches an optimum value, the strobe 25 stops generating light.

Figure 8:
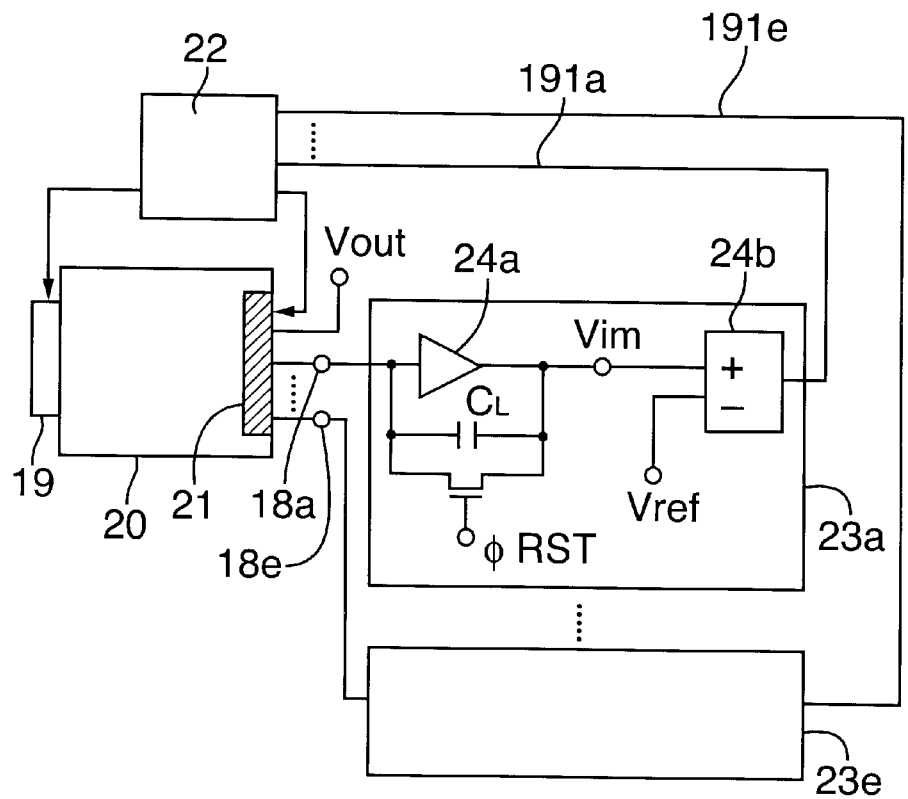
FIG. 8 is a compositional drawing showing an example of a camera including the solid-state imaging device shown in FIG. 4.
Figure 12:
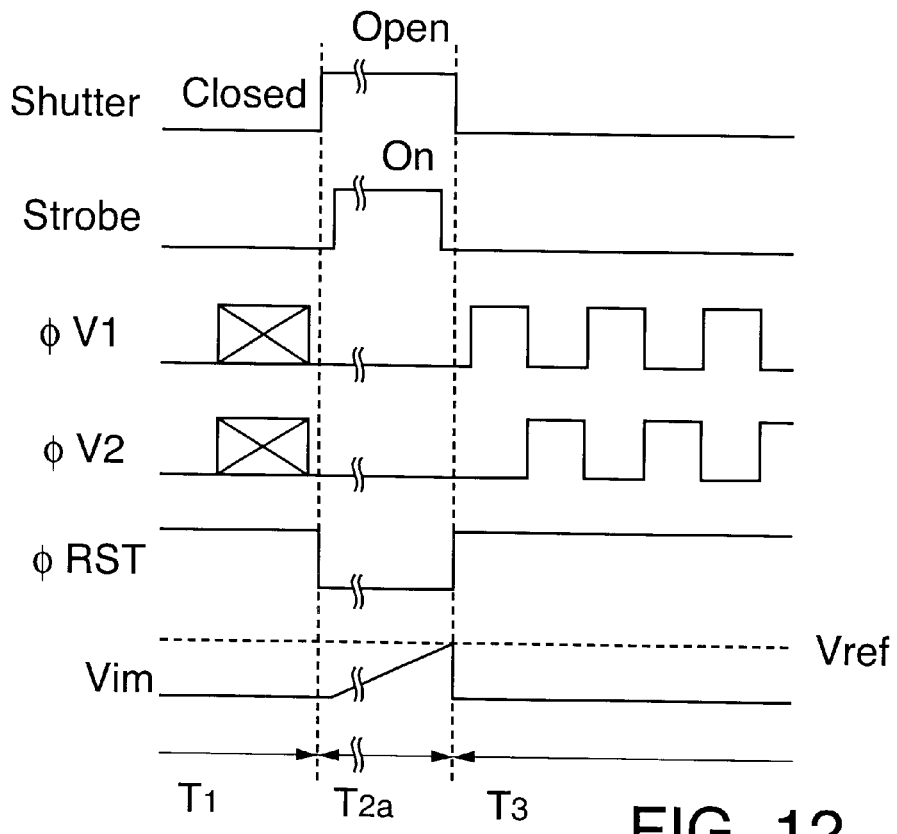
FIG. 12 shows a drive-timing chart of a CCD, shutter, and strobe when the camera shown in FIG. 10 captures a still picture.
Figure 13A:
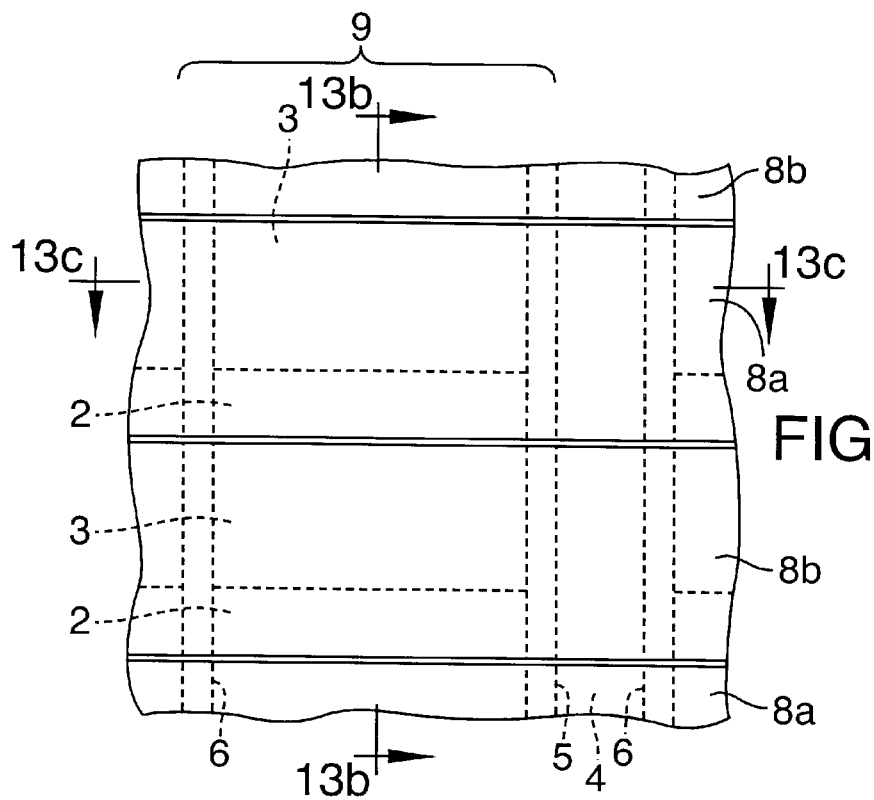
FIG. 13(a) is a top view showing a typical composition of a pixel in a conventional solid-state imaging device.
Figure 13B:
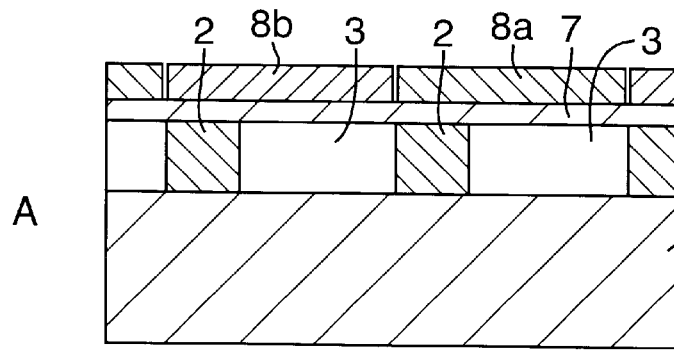
FIG. 13(b) is a cross section along the line 13b—13b shown in FIG. 13(a).
Figure 13C:
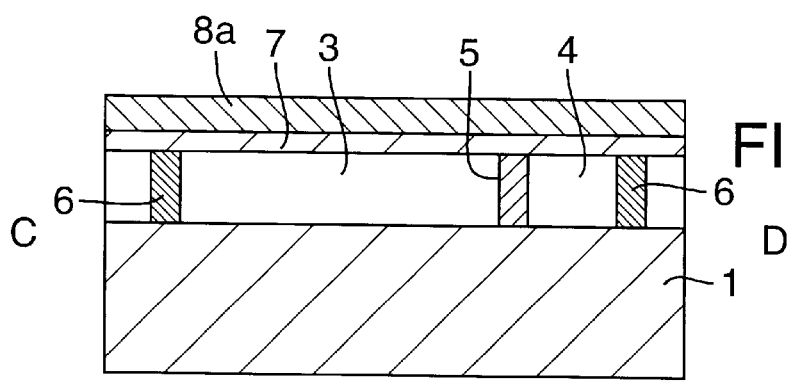
FIG. 13(c) is a cross section along the line 13c—13c shown in FIG. 13(a).
Figure 14:
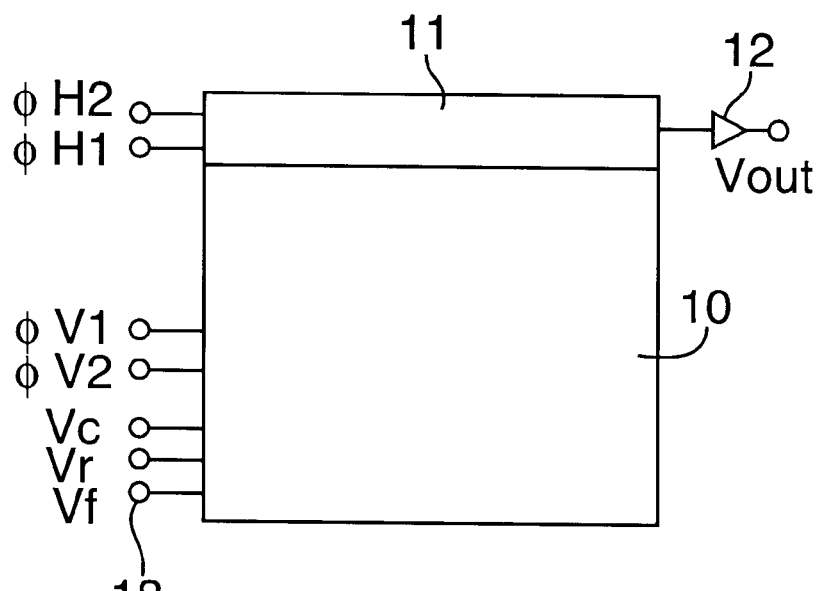
FIG. 14 is a compositional drawing showing a CCD in which the pixels of the solid-state imaging device shown in FIG. 13(a) are arranged in a two-dimensional matrix.
Figure 15:
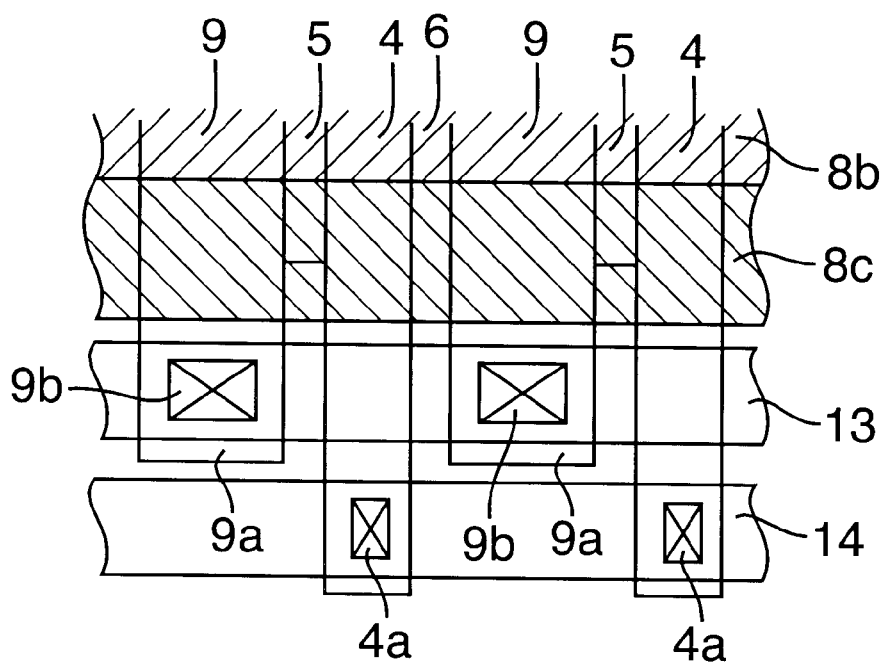
FIG. 15 is a top view showing a typical end portion, and its periphery, of the vertical-transfer portion 9 shown in FIG. 13(a).
Figure 16:
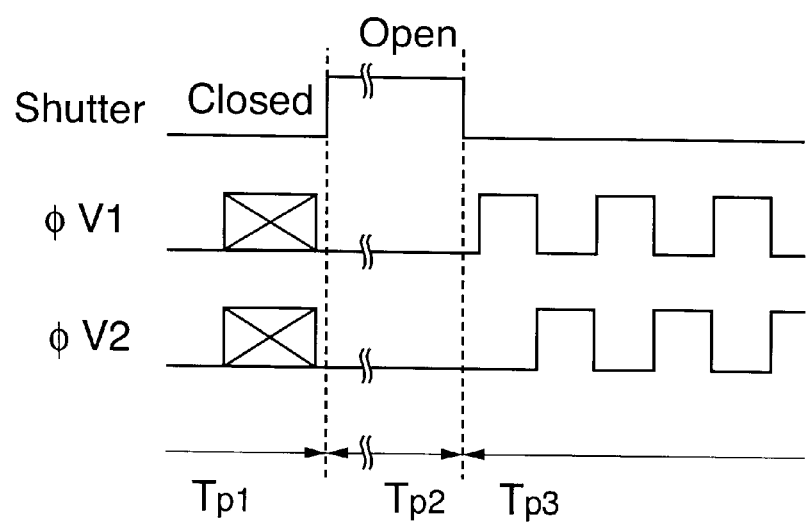
FIG. 16 shows a drive-timing chart of a CCD and a shutter when the camera shown in FIG. 14 captures a still picture.

FIG. 12 shows a drive-timing chart of the CCD 21, shutter 19, and strobe 25 whenever the camera shown in FIG. 10 captures a still picture. As much as possible, descriptions identical to descriptions accompanying FIG. 8 are omitted.

At first, a pre-exposure initialization of CCD 21 is carried out during the period T1 in a state in which the shutter 19 is closed.

Next, during the period T2a, after the clock pulses φV1, φV2 applied to the vertical-transfer gate electrodes 8a, 8b are maintained at an "L" (low) level, the shutter 19 of FIG. 10 opens, the strobe 25 generates light, and the CCD 21 enters an exposure state. At this time, signal charges Qs are stored in the N-type semiconductor region 3 of FIG. 1. When the shutter 19 opens and the strobe 25 generates light, the current Im arising in the aperture area 17a disposed in the light-receiving portion of the CCD 21 flows to the current-processing circuit 23a. The output Vim of the current-integration circuit 24a changes (rises) as shown in FIG. 12. Because the slope of the output Vim is proportional to the intensity of the light incident to the CCD 21, a desired exposure level can be obtained in real-time during an exposure by monitoring the output Vim. Namely, whenever the output Vim of the current-integration circuit 24a of FIG. 10 exceeds the reference voltage Vref (see FIG. 12), the control signal 191a transfers from the current-processing circuit 23a to the controller 22a. The controller 22a stops the strobe 25 from generating light and then closes the shutter 19.

The camera shown in FIG. 10 can obtain results identical to the camera shown in FIG. 7. Further, when using the strobe 25 with a camera in the manner as shown in FIG. 10, the intensity of light reflected by the object to be photographed (namely, the intensity of light incident to the CCD 21) is different. An extremely beneficial advantage of this is the fact that imaging is always possible using an optimum exposure level without regard to the object being photographed. This is accomplished by monitoring the quantity of incident light in real-time during an exposure.

FIGS. 2, 4, 6, 8, 10, 11 and 12 are drawings that depict the solid-state imaging device according to a second embodiment of the present invention. FIG. 2(a) is a top view showing a typical composition of a pixel in a solid-state imaging device according to the second embodiment. FIG. 2(b) is a cross section along the line 2b—2b shown in FIG. 2(a), and FIG. 2(c) is a cross section along the line 2c—2c shown in FIG. 2(a). FIGS. 2(a)–2(c) use many symbols that are identical to those used in FIGS. 1(a)–1(c). Only those components bearing different symbols are described here.

Figure 2A:
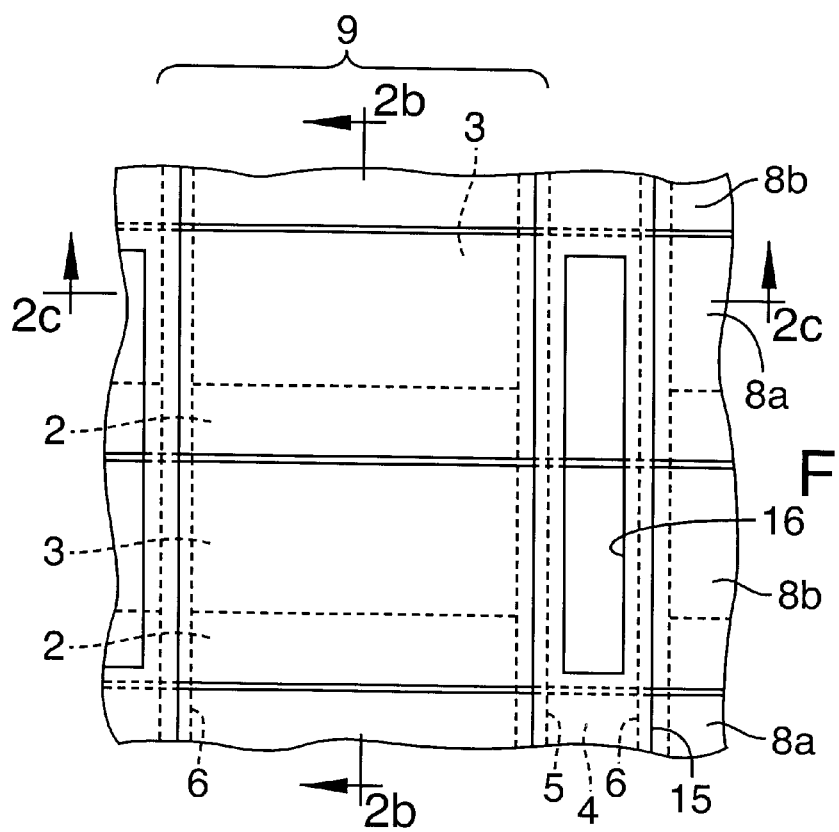
FIG. 2(a) is a top view showing a typical composition of a pixel in a solid-state imaging device according to the second embodiment of the present invention.
Figure 2B:
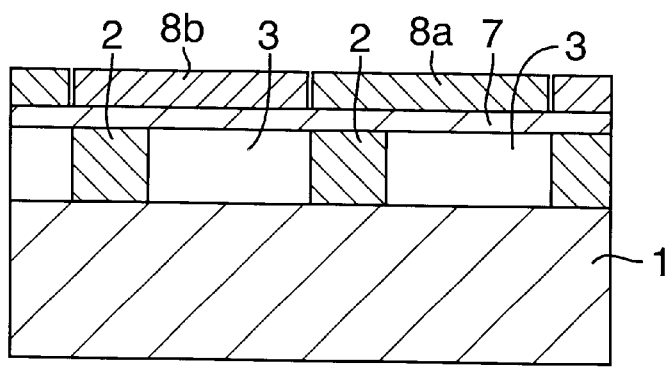
FIG. 2(b) is a cross section along the line 2b—2b shown in FIG. 2(a).
Figure 2C:
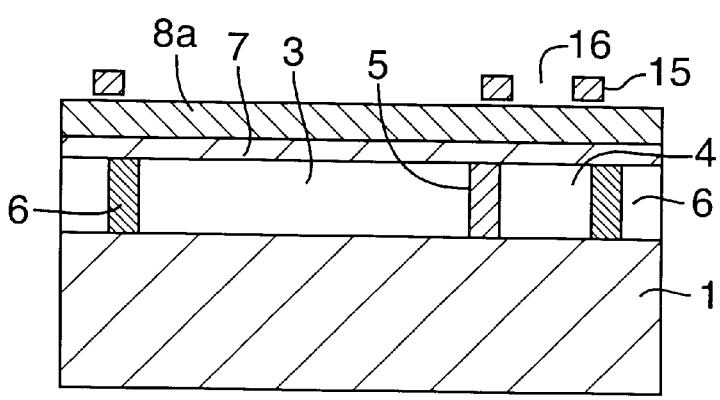
FIG. 2(c) is a cross section along the line 2c—2c shown in FIG. 2(a).

As shown in FIG. 2(c), the N-type semiconductor region (LOD diffusion region) 4 and the P-type semiconductor regions 5, 6 are formed on the surface of the P-type semiconductor substrate 1. The LOD diffusion region 4 is positioned between the P-type semiconductor regions 5 and 6. The impurity concentration in the P-type semiconductor region 5 is lower than in the P-type semiconductor region 6. Moreover, the P-type semiconductor region 5 functions as an anti-blooming barrier. Excessive electrical charge Qex that cannot be stored in the vertical-transfer portion 9 invades the P-type semiconductor region 5 and is discharged to the LOD diffusion region 4 (N-type semiconductor region). Excessive charge Qex that overflows and is collected in the LOD diffusion region 4 in this manner is output from the end portion of the LOD diffusion region 4 to the exterior of the element as an optical current (described later).

Figure 4:
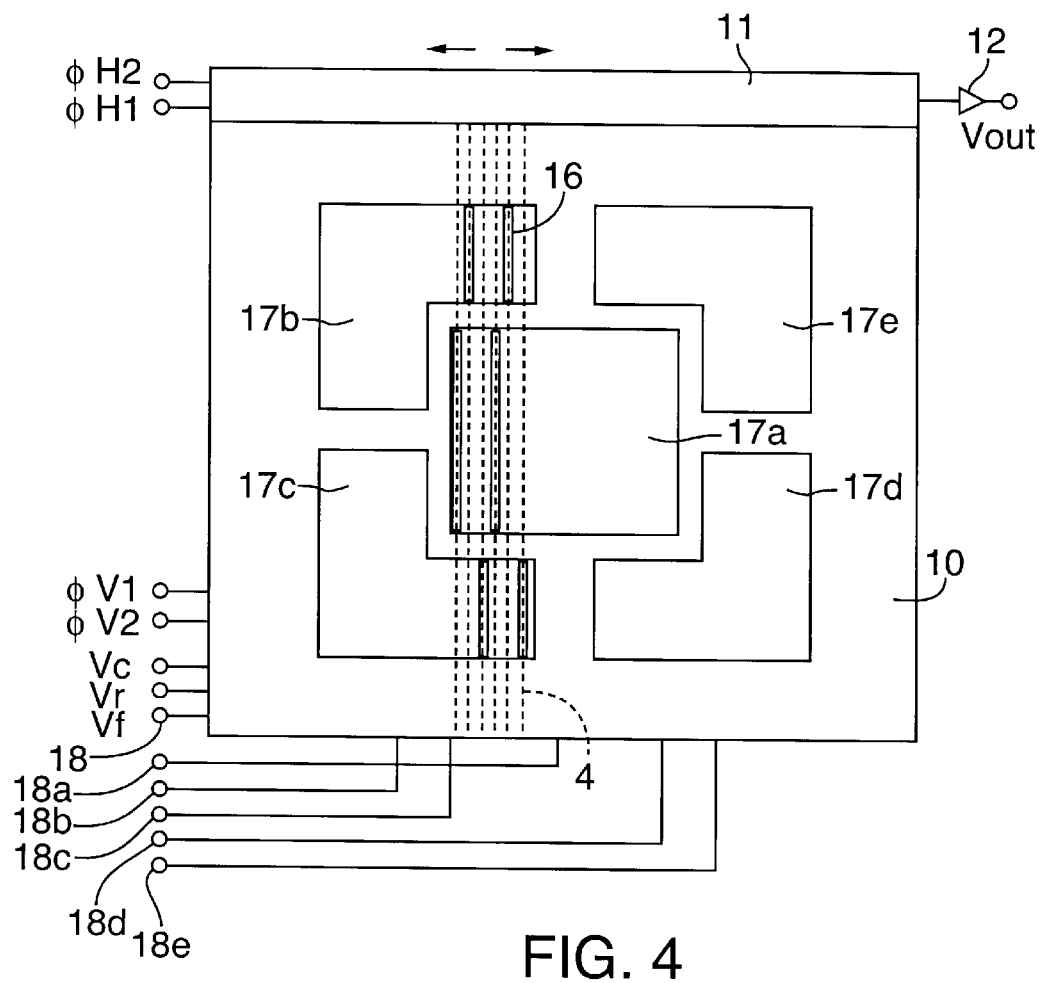
FIG. 4 is a compositional drawing showing a CCD in which the pixels of the solid-state imaging device shown in FIG. 2(a) are arranged in a two-dimensional matrix.

FIG. 4 is a compositional drawing showing a CCD in which pixels of the solid-state imaging device shown in FIG. 2 are arranged in a two-dimensional matrix. Identical symbols are used for components that are identical to those of FIG. 3. Only the different components are described here. Further, in FIG. 4, the N-type semiconductor region 4 is indicated by the broken lines, and the structure of a pixel and details of the shading membrane 15 are omitted.

A square-shaped first aperture area 17a is disposed at the center portion of the light-receiving-portion 10. L-shaped second to fifth aperture areas 17b–17e are disposed around the periphery of the aperture area 17a. The aperture portion 16 is arranged above the LOD diffusion region 4 (shown in FIG. 2) in the first to fifth aperture areas 17a–17e. The aperture portion 16 formed in the shading membrane 15 extending in the longitudinal direction is arranged such that any of the aperture areas 17a–17e belongs to the aperture portion. Because of this, the magnitude of the optical current output from one LOD diffusion region 4 is equivalent to the light intensity incident to an aperture area belonging to the aperture portion 16 disposed on the LOD diffusion region 4.

Further, as shown by the arrow, the first to third aperture areas 17a–17c can overlap each other. In such an instance aperture portion 16 located over the LOD diffusion region 4 is distributed to each aperture area 17a, 17b, and 17c. Therefore, the aperture portion 16 of each aperture area is thinned and formed in the regions where the aperture areas 17a–17c overlap in the horizontal direction. Further, when the aperture areas do not overlap in the horizontal direction, the surface-area density (numerical aperture) of the aperture portion 16 in the aperture areas 17a–17e can be freely set by thinning and forming the aperture portion 16 as well as by providing the aperture portion 16 on every pixel.

Figure 6:
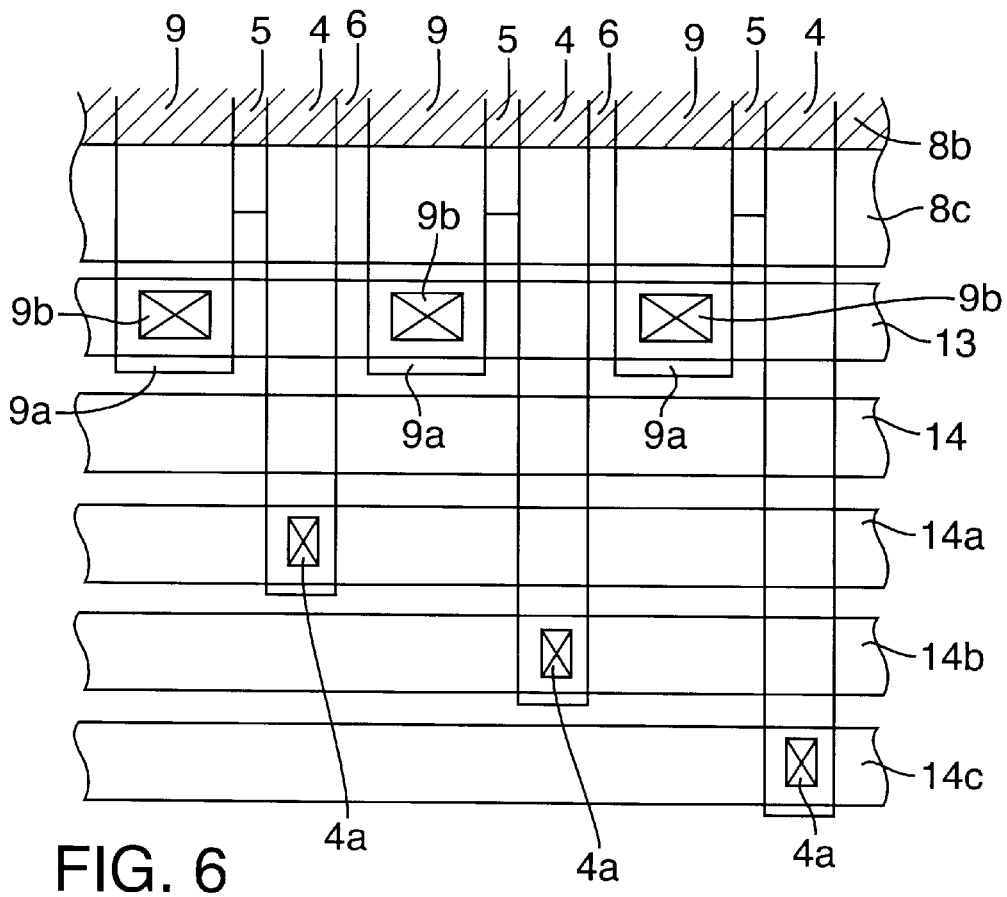
FIG. 6 is a top view showing a typical end portion (and its periphery) of a vertical-transfer portion positioned on a side opposite to a horizontal-transfer portion of the FIG. 4 CCD.

FIG. 6 is a top view showing a typical end portion (and its periphery) of a vertical-transfer portion positioned on a side opposite to the horizontal-transfer portion of FIG. 4. Identical symbols are used for components that are identical to those of FIG. 5. Only the different components are described here.

A signal read line 14a comprising aluminum wiring equivalent to the aperture area 17a is connected through the contact region 4a to the end portion of the LOD diffusion region 4. A signal read line 14b comprising aluminum wiring equivalent to the aperture area 17b is connected through the contact region 4a to the end portion of another LOD diffusion region 4. A signal read line 14c comprising aluminum wiring equivalent to the aperture area 17c is connected through the contact region 4a to the end portion of yet another LOD diffusion region 4. Further, a signal read line (not shown in figure) comprising aluminum wiring equivalent to the aperture area 17d is connected through a contact region (not shown in figure) to the end portion of yet another LOD diffusion region (not shown in figure). Further, a signal read line (not shown in figure) comprising aluminum wiring equivalent to the aperture area 17e is connected through a contact region (not shown in figure) to the end portion of yet another LOD diffusion region (not shown in figure). An aluminum wiring 14 positioned between the aluminum wiring 13 and the signal read line 14a is electrically connected to an N-type semiconductor region (not shown in figure) without being disposed under the aperture areas 17a–17e of FIG. 4.

The signal charge Qm collected in the LOD diffusion region 4 under the aperture portion 16 is output as an optical current Im from the terminals 18a–18e of FIG. 4 to the exterior of the element through the respective signal read lines 14a–14e (signal read lines 14d and 14e are not shown in the figure). The LOD diffusion region 4 also functions as an LOD. Because of this, of the signal charge Qs, any excessive electrical charge Qex generated by the light incident to the vertical-transfer portion 9 and that cannot be stored in the vertical-transfer portion 9 overflows into the LOD diffusion region 4. The excessive charge Qex passes through the signal read lines 14a–14e and is discharged to the exterior of the element through the respective terminals 18a–18e of FIG. 4.

FIG. 8 is a compositional drawing showing an example of a camera using the solid-state imaging device shown in FIG. 4. Identical symbols are used for components that are identical to components shown in FIG. 7. Only the different components are described here.

The terminals 18a–18e through which the optical current Im is output are connected to the respective current-processing circuits 23a–23e. In FIG. 8, however, the terminals 18b–18d and the corresponding current-processing circuits 23b–23d and the respective control signals 191b–191d are omitted. A respective current-integration circuit and comparator are included in each current-processing circuit 23b–23d.

FIG. 9 shows a drive-timing chart of the CCD 21 and shutter 19 whenever the camera shown in FIG. 8 captures a still picture. Only the portions that are different from a case in which the camera shown in FIG. 7 captures a still picture will be described here.

Signals from each of the first to fifth aperture areas 17a–17e are handled in like manner to the signals from the aperture area 17a at the center of the light-receiving portion when the camera shown in FIG. 7 captures a still picture.

Results identical to the first embodiment can also be obtained in the above-mentioned second embodiment.

Figure 11:
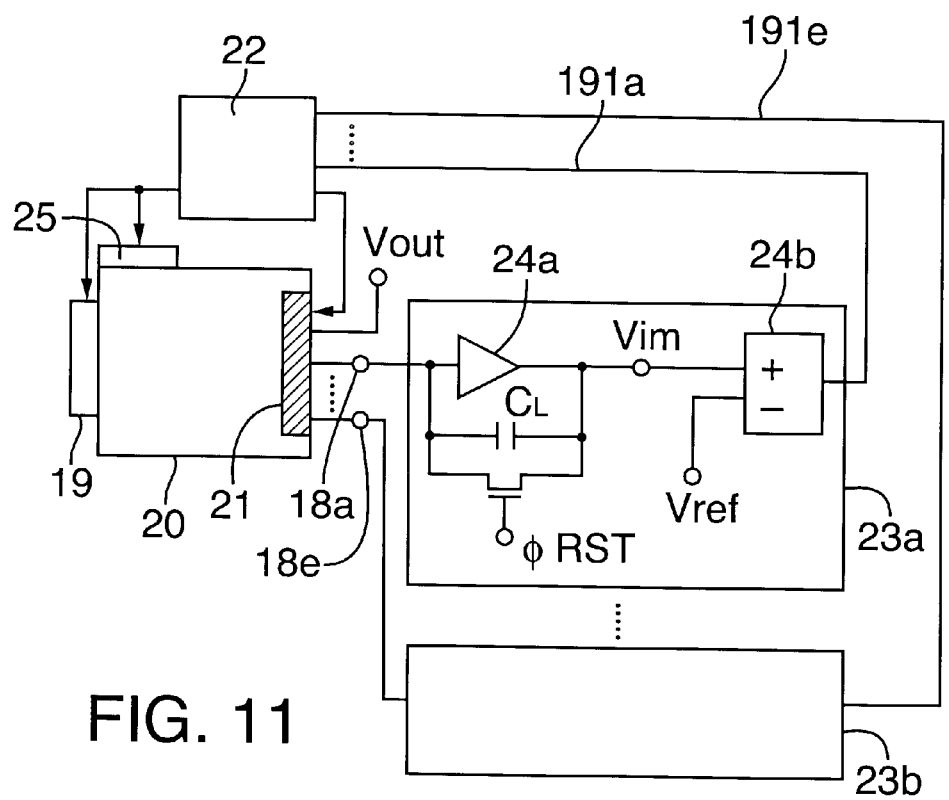
FIG. 11 is a compositional drawing showing another example of a camera including the solid-state imaging device shown in FIG. 4.

FIG. 11 is a compositional drawing showing another example of a camera using the solid-state imaging device shown in FIG. 4. Identical symbols are used for components that are identical to components shown in FIG. 8. Only the different components will be described here.

The camera of FIG. 11 uses a different method of exposure control from the camera of FIG. 8. A strobe 25 is mounted to the exterior of a dark box 20. The strobe 25 is controlled by a controller 22. The camera utilizes a method of exposure control in which the strobe 25 is used to illuminate light onto an object to be photographed. At the moment the light quantity incident to the CCD 21 reaches an optimum value, the strobe 25 stops generating light.

FIG. 12 shows a drive-timing chart for the CCD 21, shutter 19, and strobe 25 whenever the camera shown in FIG. 10 captures a still picture. As much as possible, descriptions that are identical to FIG. 8 are omitted.

At first, during the period T1, a pre-exposure initialization of the CCD 21 is carried out in a state in which the shutter 19 is closed.

Next, during the period T2a, after the clock pulses φV1, φV2 applied to the vertical-transfer gate electrodes 8a, 8b are maintained at an "L" (low) level, the shutter 19 of FIG. 11 opens, the strobe 25 generates light, and the CCD 21 enters an exposure state. At this time, the signal charge Qs is stored in the N-type semiconductor region 2 of FIG. 2. When the shutter 19 opens and the strobe 25 generates light, the optical current Im arising in the aperture area 17a disposed in the light-receiving portion of the CCD 21 flows to the current-processing circuit 23a. The output Vim of the current-integration circuit 24a changes (rises) as shown in FIG. 12. Because the slope of the output Vim is proportional to the intensity of light incident to the CCD 21, a desired exposure level can be obtained in real-time during an exposure by monitoring the output Vim. Namely, whenever the output Vim of the current-integration circuit 24a of FIG. 11 exceeds the reference voltage Vref (see FIG. 12), a control signal 191a transfers from the current-processing circuit 23a to the controller 22a, and the controller 22a stops the strobe 25 from generating light. The shutter 19 then closes.

The camera shown in FIG. 11 can produce results identical to the camera shown in FIG. 8. Further, when using the strobe 25 with a camera in the manner shown in FIG. 11, the quantity of light reflected by the object to be photographed (namely, the quantity of light incident to the CCD 21) is different. An extremely beneficial advantage of this is the fact that the quantity of supplemental light, such as produced by the strobe 25, is controlled and imaging is always possible using an optimum exposure level without regard to the object being photographed. This is achieved by monitoring the quantity of incident light in real-time during an exposure.

The solid-state imaging device according to the first embodiment has an N-type semiconductor region 4 that functions as an exposure sensor; the device does not have an LOD diffusion region. The solid-state imaging device according to the second embodiment has an N-type semiconductor region 4 that functions both as an exposure sensor and an LOD. However, the present invention is not limited to these embodiments and can be suitably modified by, for example, forming an N-type semiconductor region in an aperture area that functions as an exposure sensor, or forming an LOD diffusion region in another region. There is a benefit in which, by forming an LOD diffusion region in a region other than an aperture area in this manner, even if the exposure sensor does not operate when a strong light strikes that region only, blurring of the image of that portion can be controlled.

Therefore, according to the present invention as described above, solid-state imaging devices and cameras comprising the same are provided that can detect changes in light quantity directly incident to a light-receiving portion in real-time. Light information is read at an optimum exposure level whenever estimates of the quantity of incident light are difficult to obtain and whenever the quantity of incident light suddenly changes from an estimated value.

Whereas the invention has been described in connection with multiple embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A solid-state imaging device, comprising:
a charge-transfer portion that generates and stores electrical signal charges in response to light incident on the charge-transfer portion, and transfers the signal charges;
an output portion that outputs the signal charges, received from the charge-transfer portion, as an electrical signal;
a semiconductor region that generates signal charges in proportion to the quantity of light incident on the semiconductor region; and
a shading membrane having an aperture portion formed on the semiconductor region.

2. A solid-state imaging device comprising:
a charge-transfer portion that generates and stores signal charges in response to light incident on the charge-transfer portion, and transfers the signal charges;
an output portion that outputs the signal charges, received from the charge-transfer portion, as an electrical signal;
a semiconductor region, formed adjacent the charge-transfer portion, through which a signal charge flows, the signal charge flowing through the semiconductor region being an excess charge generated by the charge-transfer portion, the semiconductor region also generating a signal charge in proportion to the quantity of light to the semiconductor region; and
a shading membrane having an aperture portion formed on the semiconductor region.

3. The solid-state imaging device of either claim 1 or claim 2, further comprising a read portion that reads out signal charges, generated by light incident to the semiconductor region through the aperture portion, to the exterior of the semiconductor region.

4. A solid-state imaging device, comprising:
a charge-transfer portion that generates and stores electrical signal charges in response to light incident on the charge-transfer portion and then transfers the signal charge;
an output portion that outputs the signal charges, received from the charge-transfer portion, as an electrical signal;
a plurality of semiconductor regions that generate signal charges in proportion to the quantity of light incident on the semiconductor regions;
a shading membrane having an aperture portion formed on the semiconductor region; and
a plurality of aperture areas formed from a plurality of apertures from among the aperture portions.

5. A solid-state imaging device, comprising:
a plurality of charge-transfer portions that generate and store electrical signal charges in response to light incident on the charge-transfer portions, and that transfer the signal charges;
an output portion that outputs the signal charges, received from the charge-transfer portions, as an electrical signal;
a semiconductor region, formed adjacent to the charge-transfer portions, through which an electrical signal charge flows, the signal charge flowing through the semiconductor region being an excess charge generated by the charge-transfer portions, the semiconductor region also generating a signal charge in proportion to the quantity of light incident on the semiconductor region;
a shading membrane having an aperture portion formed on the semiconductor region; and a plurality of aperture areas formed from a plurality of apertures from among the aperture portions.

6. The solid-state imaging device of either claim 4 or claim 5, further comprising read portions, formed at each of the aperture areas, that read out signal charges, generated by light incident to the semiconductor regions through the aperture portions, to the exterior of the semiconductor regions.

7. A camera, comprising:
 (a) a solid-state imaging device, comprising:
  a charge-transfer portion that generates and stores electrical signal charges in response to light incident on the charge-transfer portion, and transfers the signal charges;
  an output portion that outputs the signal charges, transferred from the charge-transfer portion, as an electrical signal;
  a semiconductor region that generates an optical current in proportion to the quantity of light incident on the semiconductor region;
  a shading membrane having an aperture portion formed on the semiconductor region; and
  a read portion that reads out an optical current, generated by light incident on the semiconductor region through the aperture portion, to the exterior of the semiconductor region; and
 (b) a shutter that blocks light incident to the solid-state imaging device;
 (c) a current-integration circuit that converts the optical current read from the read portion into a corresponding voltage;
 (d) a comparator that compares the voltage converted by the current-integration circuit to a reference voltage; and
 (e) a controller that determines a timing to close the shutter responsively to the comparison result output by the comparator.

8. A camera, comprising:
 (a) a solid-state imaging device, comprising:
  a charge-transfer portion that generates and stores electrical signal charges in response to light incident on the charge-transfer portion and transfers the signal charges;
  an output portion that outputs the signal charges, transferred from the charge-transfer portion, as an electrical signal;
  a semiconductor region, formed adjacent the charge-transfer portion, through which a signal charge flows, the signal charge flowing through the semiconductor region being an excess charge generated by the charge-transfer portion, the semiconductor region also generating an optical current in proportion to the quantity of light incident on the semiconductor region;
  a shading membrane having an aperture portion formed on the semiconductor region; and
  a read portion that reads out the optical current, generated by light incident to the semiconductor region through the aperture portion, to the exterior of the semiconductor region;
 (b) a shutter that blocks light incident to the solid-state imaging device;
 (c) a current-integration circuit that converts the optical current read from the read portion into a corresponding voltage;
 (d) a comparator that compares the voltage converted by the current-integration circuit to a reference voltage; and
 (e) a controller that determines a timing in which to close the shutter in response to the comparison result produced by the comparator.

9. The camera of either claim 7 or claim 8, further comprising a strobe that illuminates light onto an object to be photographed, wherein the controller further determines a timing, in response to the comparison result produced by the comparator, to stop the strobe from generating light.

* * * * *